United States Patent
Vukovic-Cvijin

(10) Patent No.: US 9,804,028 B2
(45) Date of Patent: Oct. 31, 2017

(54) EXTERNAL CAVITY LASER SOURCE

(71) Applicant: Spectral Sciences, Inc., Burlington, MA (US)

(72) Inventor: Pajo Vukovic-Cvijin, Salem, MA (US)

(73) Assignee: Spectral Sciences, Inc., Burlington, MA (US)

( * ) Notice: Subject to any disclaimer, the term of this patent is extended or adjusted under 35 U.S.C. 154(b) by 19 days.

(21) Appl. No.: 14/616,673

(22) Filed: Feb. 7, 2015

(65) Prior Publication Data

US 2015/0211929 A1 Jul. 30, 2015

Related U.S. Application Data

(63) Continuation of application No. 13/154,516, filed on Jun. 7, 2011, now Pat. No. 9,042,414.

(Continued)

(51) Int. Cl.
| | |
|---|---|
| *H01S 3/10* | (2006.01) |
| *G01J 3/433* | (2006.01) |
| *G01J 3/10* | (2006.01) |
| *H01S 5/14* | (2006.01) |
| *H01S 5/40* | (2006.01) |

(Continued)

(52) U.S. Cl.
CPC ............ *G01J 3/433* (2013.01); *G01J 3/0229* (2013.01); *G01J 3/10* (2013.01); *G01J 3/18* (2013.01); *H01S 3/08009* (2013.01); *H01S 5/1092* (2013.01); *H01S 5/141* (2013.01); *H01S 5/3402* (2013.01); *H01S 5/4062* (2013.01); *H01S 5/4087* (2013.01); *G01J 2003/423* (2013.01); *H01S 3/0816* (2013.01); *H01S 5/02248* (2013.01)

(58) Field of Classification Search
CPC ........ G01J 3/433; G01J 3/18; G01J 2003/423; G01J 3/10; G01J 3/0229; H01S 3/08009; H01S 5/1092; H01S 5/3402; H01S 5/4087; H01S 3/005; H01S 5/141; H01S 5/4062; H01S 3/0816; H01S 5/02248
USPC ................. 372/20, 92, 98, 102, 99, 101, 26; 356/300–334, 451–456; 250/338.5–339.13, 341.8, 343–346, 373
See application file for complete search history.

(56) References Cited

U.S. PATENT DOCUMENTS

| | | |
|---|---|---|
| 5,061,049 A | 10/1991 | Hornbeck |
| 6,282,213 B1 | 8/2001 | Gutin et al. |

(Continued)

OTHER PUBLICATIONS

Bjorkland, G.C., et al; "Frequency-modulation spectroscopy: a new method for measuring weak absorptions and dispersions;" Optics Letters, vol. 5, No. 1, pp. 15-17 (Jan. 1980).

(Continued)

*Primary Examiner* — Jessica Manno
*Assistant Examiner* — Delma R Forde
(74) *Attorney, Agent, or Firm* — Brian M. Dingman; Dingman IP Law, PC

(57) ABSTRACT

A tunable laser source that includes multiple gain elements and uses a spatial light modulator in an external cavity to produce spectrally tunable output is claimed. Several designs of the external cavity are described, targeting different performance characteristics and different manufacturing costs for the device. Compared to existing devices, the tunable laser source produces high output power, wide tuning range, fast tuning rate, and high spectral resolution.

15 Claims, 12 Drawing Sheets

Related U.S. Application Data

(60) Provisional application No. 61/358,135, filed on Jun. 24, 2010.

(51) Int. Cl.
| | | |
|---|---|---|
| *G01J 3/02* | (2006.01) | |
| *G01J 3/18* | (2006.01) | |
| *H01S 3/08* | (2006.01) | |
| *H01S 5/10* | (2006.01) | |
| *H01S 5/34* | (2006.01) | |
| H01S 3/081 | (2006.01) | |
| H01S 5/022 | (2006.01) | |
| G01J 3/42 | (2006.01) | |

(56) References Cited

U.S. PATENT DOCUMENTS

| | | | | |
|---|---|---|---|---|
| 6,528,791 | B1* | 3/2003 | Williams | G01J 3/18 250/339.08 |
| 6,671,295 | B2 | 12/2003 | Gutin | |
| 7,248,358 | B2* | 7/2007 | Geshwind | G01J 3/02 356/310 |
| 7,324,196 | B2 | 1/2008 | Goldstein et al. | |
| 8,144,321 | B2* | 3/2012 | Duncan | G01J 3/02 356/310 |
| 8,305,575 | B1* | 11/2012 | Goldstein | G01J 3/021 356/326 |
| 9,042,414 | B2 | 5/2015 | Vukovic-Cvijin et al. | |
| 2007/0153866 | A1* | 7/2007 | Shchegrov | G02B 27/102 372/50.124 |
| 2012/0206725 | A1* | 8/2012 | Vukovic-Cvijin | G01J 3/10 356/402 |
| 2015/0029503 | A1* | 1/2015 | McMackin | G01J 3/18 356/300 |

OTHER PUBLICATIONS

Breede, M., et al; "Micromirror device controlled tunable diode laser;" Electronics Letters; vol. 43, Iss. 8; pp. 456-457 (Apr. 12, 2007).

Goldstein, N. et al; "Programmable Adaptive Spectral Imagers for Mission-Specific Application in Chemical/Biological Sensing;" Intl J. High Speed Elect & Syst; vol. 17, Issue 4, pp. 749-760 (2007).

Goldstein, N. et al; "DMD-based adaptive spectral imagers for hyperspectral imagery and detection of spectral signatures;" SPIE, vol. 7210/Hyperspectral Imaging and Multi-Object Sensing, paper 7210-7 (2009).

Ignjatijevic, D. et al; "A simple microcomputer-controlled CO2 laser wavelength tuning system;" Optics and Laser Tech. pp. 96-98, (Apr. 1985).

Li, M.J. et al; "JWST Microshutter Array System and Beyond;" Proc. SPIE, vol. 7594 (Invited Paper), pp. 1-9 (2010).

Lyakh, A. et al; "High-performance continuous-wave room temperature 4.0-um quantum cascade lasers with single-facet optical emission exceeding 2 W;" PNAS, vol. 1007, No. 44, pp. 18799-18802 (Nov. 2, 2010).

Maulini, R. et al; "External cavity quantum-cascade laser tunable from 8.2 to 10.4um using a gain element with a heterogeneous cascade;" App. Physics Letters 88, 201113 (2006).

Senturia, S.D. et al; "Programmable diffraction grantings and their uses in displays, spectroscopy, and communications;" J. Microlith. Microfab., Microsyst. 4(4) 04140 (Oct.-Dec. 2005).

Trisnadi, J.I. et al; "Overview and applications of Grating Light Valve TM based optical write engines for high-speed digital imaging;" presented at Photonics West 2004—Micromachining and Microfabrication Symposium, San Jose, CA, 13 pgs. (Jan. 26 2004).

Vujkovic-Cvijin, P. et al; "Diode Laser-Based Lidars: The Next Generation;" SPIE Conf. on Applic. of Tunable Diode and Other Infrared Sources for Atmospheric Studies and Industrial Processing Monitoring II; Denver, CO; SPIE, vol. 3758 (Jul. 1999).

Vujkovic-Cvijin, P. et al; "Mobile Remote Sensor for Leak Detection in Natural Gas Pipelines;" Proc. of IGRC 2001, Paper DO-02 Amsterdam (2001).

Vujkovic-Cvijin, P. et al; "Adaptive spectral imager for space-based sensing;" Proc. SPIE vol. 6206, paper 6206-33 (2006).

Warren, D. et al; "Compact prism spectrographs based on aplanatic principles;" Opt. Eng. 36(4); pp. 1174-1182 (Apr. 1997).

Digital Light Innovations, product brochure; http://www.dlinnovations.com/products/; last accessed Sep. 7, 2011.

* cited by examiner

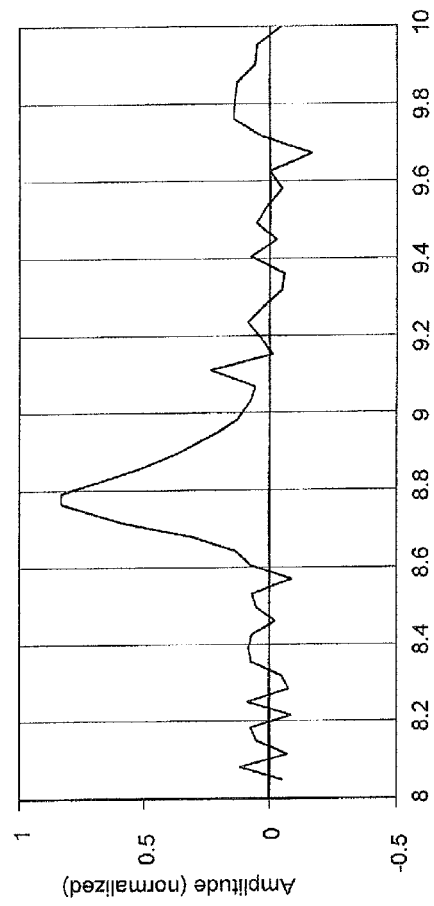
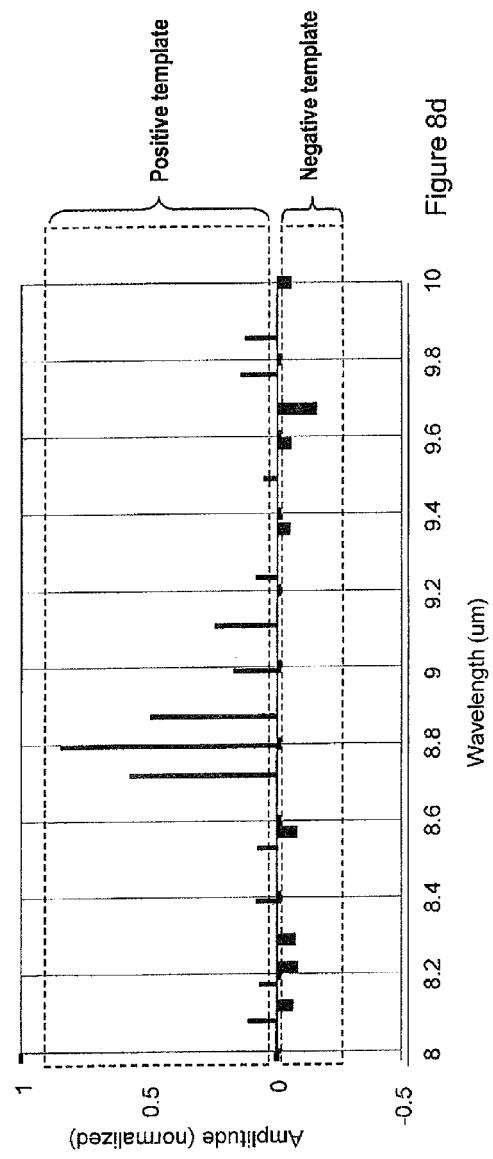

EXTERNAL CAVITY LASER SOURCE

CROSS-REFERENCE TO RELATED APPLICATIONS

This application is a continuation of and claims priority of application Ser. No. 13/154,516, filed on Jun. 7, 2011, which itself claims priority of Provisional Patent Application Ser. No. 61/358,135, filed on Jun. 24, 2010. The contents of the priority applications are incorporated herein by reference.

GOVERNMENT RIGHTS

This invention was made partially under Phase I SBIR Contract No.: D11PC20141 awarded by the Department of Homeland Security. The government has certain rights in the invention.

FIELD

This disclosure is in the technical field of tunable lasers, more particularly, tunable lasers containing an external cavity. Furthermore, it is in the technical field of laser spectroscopy with advanced excitation waveforms.

BACKGROUND

A common way to force a tunable laser gain medium to produce output at a specific wavelength is to couple the gain medium to an external laser cavity. The external cavity disperses the intracavity radiation into its spectral components and selects the wavelength whose oscillation in the laser cavity is sustained. Typically, this wavelength has the highest gain/loss ratio among the competing wavelengths (cavity modes).

External cavity tuning is generally the preferred way of laser tuning when wide tuning range is required. Besides wide range, it provides wavelength reproducibility and stability over time. High tuning speed, however, has been difficult to achieve simultaneously with a wide tuning range, with external cavity designs in the past.

FIG. 1a illustrates the traditional Litrow design of an external cavity 10, with gain element 12, lens 14 and diffraction grating 16. In this case, the laser power is out coupled from the cavity through the zero-th order reflection of grating 16 [e.g., Maulini, 2006]. Laser tuning is achieved by grating rotation. In this simplest form of the Litrow design, tuning by grating rotation has an additional disadvantage that it changes the direction of the output beam. Laser tuning by mechanical rotation of the grating, although amenable to computer control [e.g., Ignjatijevic and Vujkovic-Cvijin et al., 1985], is clearly not well-suited for fast laser tuning.

An approach which makes external cavity tuning both fast and digitally programmable, while retaining the advantages of external cavity tuning, makes use of a spatial light modulator (SLM) located inside the cavity, to spatially modulate the reflectivity of one of the "cavity mirrors." With a dispersive device inside the cavity, the spatial modulation of the SLM translates into spectral modulation, resulting in lasing action at the desired wavelength. A device which uses a SLM for external cavity tuning has been described previously by Gutin [Gutin, 2001, Gutin, 2003] and by Breede et al. [Breede et al., 2007].

In a typical example of such a cavity 20 shown on FIG. 1b, the laser gain element 22 is anti-reflection (AR) coated at the facet facing the external cavity, while the coating of the opposite facet is suitable for laser beam out coupling. The light emerging from the AR coated facet is collimated with a high numerical aperture (NA) lens 24 and directed to a diffraction grating or other dispersive element 26. The first-order diffracted beam is captured by a lens (not shown) and directed towards the SLM 28, typically represented by a Digital Micromirror Array (DMA) [Hornbeck, 1991, Digital Light Innovations, 2011]. Dispersed beams of different wavelengths are spatially resolved on the surface of the DMA where individually addressable micromirrors select the wavelength which is sent back to oscillate in the cavity. The DMA operates by tilting its micromirrors between two predetermined stable states, under digital electronic control. In one of the states, the micromirrors reflect the beam back to the gain element (the "on" state), while in the other state, the light is decoupled from the cavity (the "off" state). The wavelength corresponding to the spatial position on the DMA with micromirrors turned "on" will oscillate in the cavity. As a consequence, laser tuning under fast digital electronic control inherent to the DMA modulator becomes possible. Since the digitally controlled external cavity laser has the ability to turn on or off any wavelength in any order, any laser wavelength can be accessed at random, as opposed to sequential wavelength tuning. Random access tuning is a unique feature of digitally controlled external cavity laser tuning.

SUMMARY

This disclosure describes an approach which in one non-limiting embodiment uses multiple gain elements that operate within a single external cavity, producing a laser source with a wider tuning range and higher output power than heretofore possible. The disclosure also describes an external cavity fabricated, completely or partially, out of transparent solid state optical material which makes the laser source resistant to external disturbances and therefore more practically useful.

This disclosure comprises in one embodiment the use of multiple gain elements within the same laser cavity. This disclosure also describes a particularly advantageous approach to realizing external laser cavities, based on building a cavity, completely or partially, inside a block of transparent optical material. Well-corrected wide-field imaging spectrometers with SLM modulators can be used as the foundation for external laser cavity designs that allow placement of multiple gain elements in a single cavity. Due to sufficiently wide field, these elements experience essentially the same feedback from the cavity, which makes any gain element capable of producing lasing action at the desired wavelength selected by the SLM.

This disclosure also describes the use of fast non-sequentially tunable (random wavelength access) laser to construct spectral output tailored to enhance the sensitivity of spectroscopic detection of materials and features partially obscured by the background or by interfering species.

Advantages of the Present Invention Include, without Limitation, One or More of the Following:
 (1) external laser cavity with simple and robust optics;
 (2) external laser cavity operating simultaneously with multiple laser gain elements, each independently tunable;
 (3) wider tuning range than existing designs, due to multiple gain elements;
 (4) higher output power per wavelength, when multiple lasers are tuned to the same wavelength;
 (5) higher total laser output power;

(6) fast random access to any wavelength within the gain medium spectrum;
(7) enhanced spectroscopic detection sensitivity due to in-hardware processing during data acquisition;
(8) enhanced spectroscopic detection sensitivity due to advanced wavelength modulation techniques used to generate the signal corresponding to the spectral features of the analyte and not to those of the background or interferents.

This disclosure features a tunable laser containing an external cavity comprising multiple tunable gain elements providing sources of optical radiation at different wavelengths, a spectral dispersion device producing radiation dispersed into separate wavelengths, a spatial light modulator (SLM) defining a plurality of sub-apertures that are adapted to change their reflectivity, transmissivity or diffraction properties, one or more optical elements that provide intracavity beam shaping and imaging, and a control system that causes the SLM sub-apertures to change their properties, to determine the output wavelength of the laser.

The multiple tunable optical gain elements may comprise devices structured as semiconductor diodes, quantum cascade devices or inter-sub-band devices. The multiple tunable optical gain elements may comprise crystals, dyes, or may be in the gaseous state. The dispersion element may be diffractive, refractive, or a combination of refractive and diffractive elements. The dispersion element may be diffractive either in reflection or transmission. The dispersion element may comprise one or more spectral filters, and may comprise an array of spectral filters. The SLM may comprise a digital micromirror array.

The spatial light modulator may comprise a micromirror array, a micromechanical ribbon array, a liquid crystal array, or an array of apertures that are adapted to open and close under digital control. The spatial light modulator may comprise microshutters. The tunable laser may further comprise a solid optically transparent object that defines at least part of the volume of the cavity. The optically transparent object may comprise multiple blocks that are coupled together to create the cavity. The spectral dispersion device and the SLM may each be mounted to a block.

The control system may be enabled to automatically perform spectroscopic signal processing on the SLM by applying a mathematical transform to generate a set of output laser wavelengths in order to enhance the detection sensitivity of the system, or reduce the time needed to perform chemical analysis or material identification, or reduce laser power requirements needed to perform chemical analysis or material identification. The control system may control the SLM to accomplish time-multiplexed modulation of multiple laser wavelengths or a matched filter or derivative spectroscopy or derivative spectroscopy with non-adjacent wavelengths. The control system may be enabled to automatically perform spectroscopic signal processing on the SLM by applying a mathematical transform to generate a set of output laser wavelengths in order to enhance the detection sensitivity of the system, or reduce the time needed to perform chemical analysis or material identification, or reduce laser power requirements needed to perform chemical analysis or material identification, and the control system may control the SLM to accomplish time-multiplexed modulation of multiple laser wavelengths or a matched filter or derivative spectroscopy or derivative spectroscopy with non-adjacent wavelengths.

This disclosure also features a tunable laser containing an external cavity comprising one or more tunable gain elements providing sources of optical radiation at different wavelengths, a spectral dispersion device producing radiation dispersed into separate wavelengths, a digital micromirror array (DMA) that defines a plurality of sub-apertures that are adapted to change their reflectivity, transmissivity or diffraction properties, one or more optical elements that provide intracavity beam shaping and imaging, a solid optically transparent object that defines at least part of the volume of the cavity, and a control system that causes the sub-apertures of the DMA to change their reflectance properties, to determine one or more output wavelengths of the laser.

The control system may be enabled to automatically perform spectroscopic signal processing on the DMA by applying a mathematical transform to generate a set of output laser wavelengths in order to enhance the detection sensitivity of the system, or reduce the time needed to perform chemical analysis or material identification, or reduce laser power requirements needed to perform chemical analysis or material identification. The control system may control the DMA to accomplish time-multiplexed modulation of multiple laser wavelengths or a matched filter or derivative spectroscopy or derivative spectroscopy with non-adjacent wavelengths. The optically transparent object may comprise multiple blocks that are coupled together to create the cavity. The spectral dispersion device and the SLM may each be carried by at least one block.

This disclosure further features a tunable laser containing an external cavity comprising one or more tunable gain elements providing sources of optical radiation at different wavelengths, a spectral dispersion device producing radiation dispersed into separate wavelengths, a spatial light modulator (SLM) defining a plurality of sub-apertures that are adapted to change their reflectivity, transmissivity or diffraction properties, one or more optical elements that provide intracavity beam shaping and imaging, and a control system that causes the SLM sub-apertures to change their properties, to determine the output wavelength of the laser, wherein the control system causes the creation of a series of specific wavelength bands selected to detect or quantify a specific analyte based on laser light absorption, transmission or reflectance so as to discriminate the spectral features of the analyte from those of the background or interfering species.

The control system may implement a matched filter for the analyte via selection of appropriate wavelengths and weighting factors. The control system may cause the SLM sub-apertures to change their properties so as to modulate at least two or more of the specific wavelengths at different frequencies.

Further featured are an infrared spectrometer comprising the tunable laser described herein, an infrared spectral imaging microscope comprising the tunable laser described herein, a standoff spectroscopic detection instrument comprising the tunable laser described herein, and a trace gas spectrometer comprising the tunable laser described herein.

BRIEF DESCRIPTION OF THE DRAWINGS

Other objects features and advantages will occur to those skilled in the art from the following description of embodiments and the accompanying drawings, in which:

FIGS. 8c and 8d show a hypothetical example of a matched filter, including one in a discrete form suitable for use with tunable lasers.

DETAILED DESCRIPTION OF EMBODIMENTS

Figures 1A, 1B:
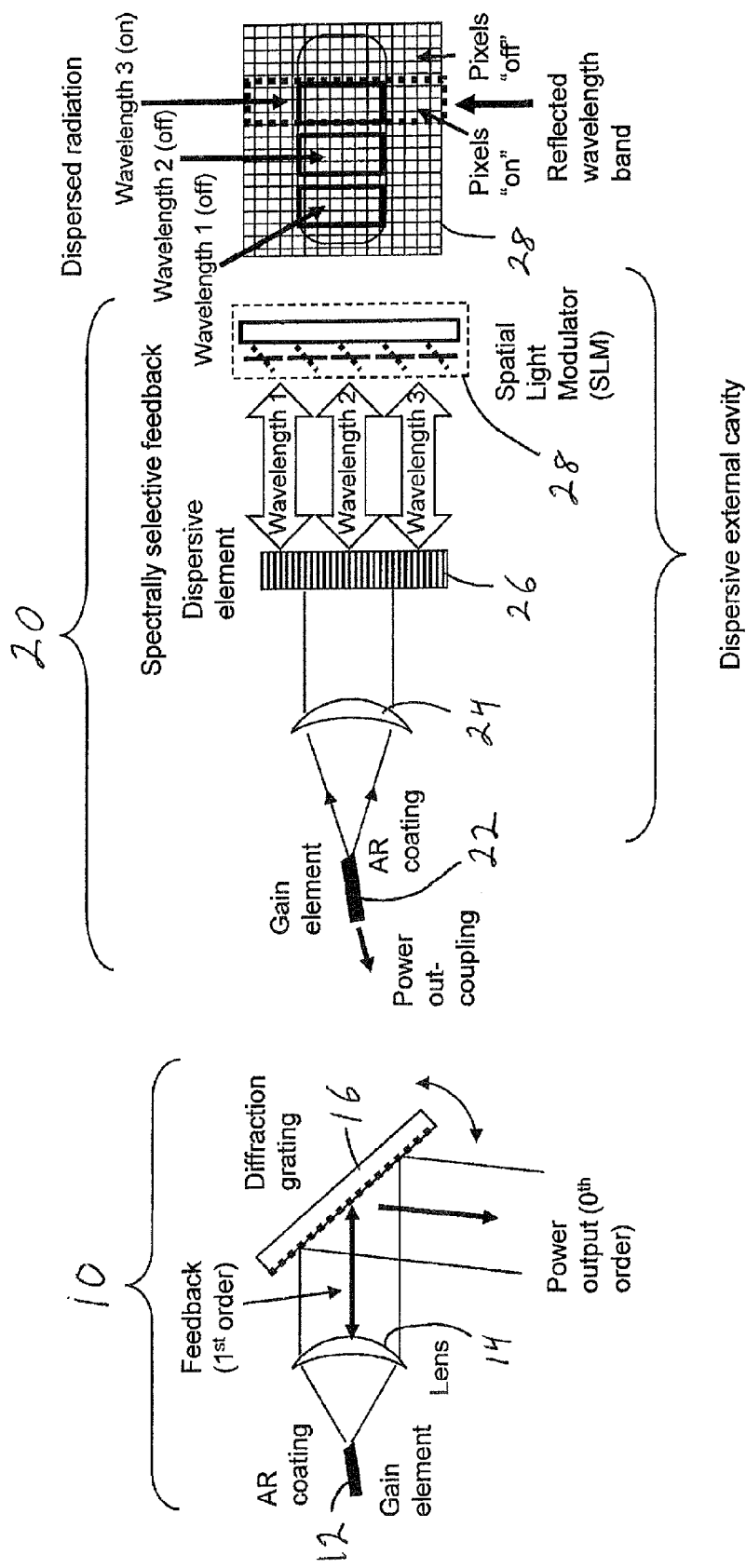
FIG. 1a is a schematic diagram of a prior art tunable external cavity laser in which tuning is accomplished with grating rotation.
FIG. 1b is a schematic diagram of a prior art tunable external cavity laser in which tuning is accomplished with a spatial light modulator (SLM) located in the external cavity.
Figure 2:
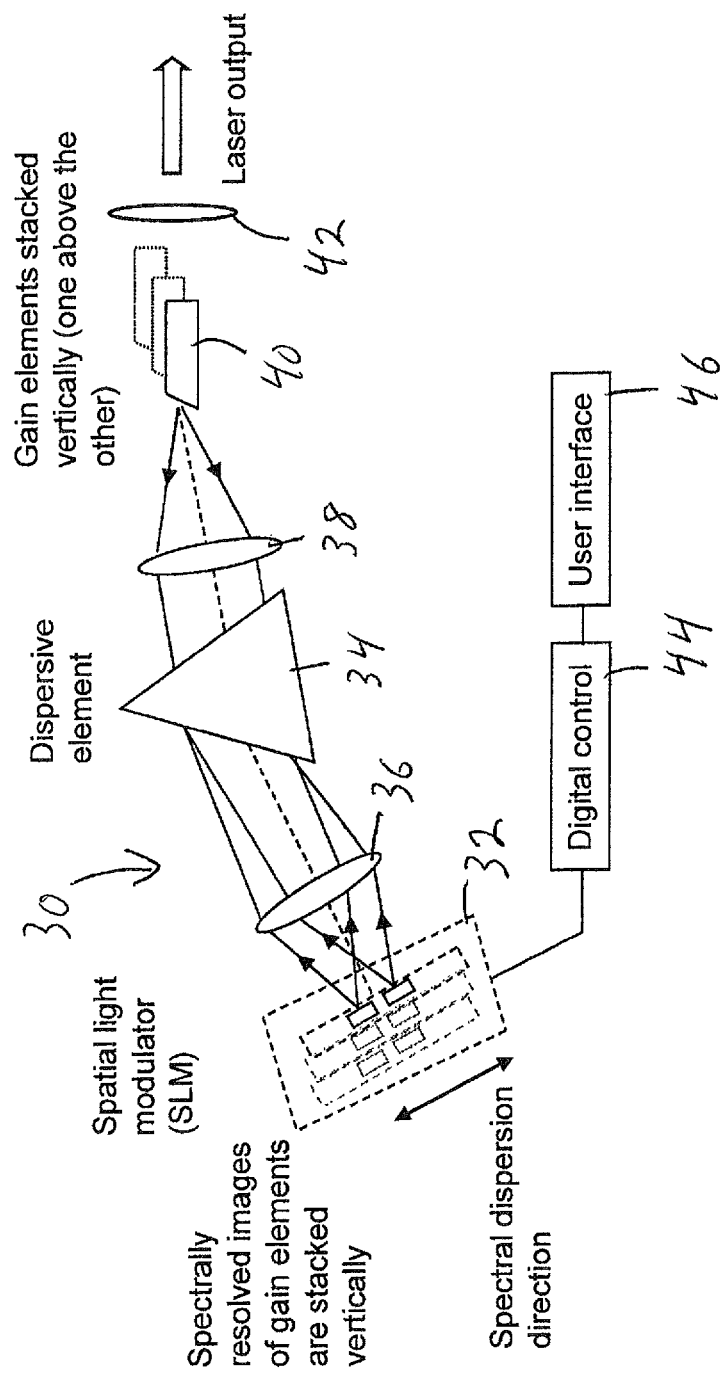
FIG. 2 is a schematic diagram of a tunable external cavity with a digitally controlled intracavity SLM and with multiple gain elements.

FIG. 2 shows a general representation corresponding to several external cavity designs 30 with computer-controlled digital tuning (using user interface 46 and controller 44) made possible by a reflective intracavity SLM 32. The gain medium 40 can be a semiconductor device (e.g. a diode laser, a quantum cascade laser, an inter-sub-band laser), a crystal (typically optically pumped), a dye (typically optically pumped), a gas, or any other tunable laser medium. The dispersive element 34 in the cavity can be a diffraction grating, a prism, a grism (combination prism and grating), one or more spectral filters, or a combination thereof. Lenses 36 and 38 focus and image the light in the cavity. Lens 42 collimates the laser output. The SLM inside the cavity can be a micromirror array (DMA), a reflective or diffractive ribbon-like array [Trisnadi, et al., 2004, Senturia et al., 2005], a liquid-crystal array, an array of programmable apertures (e.g., microshutters [Li et al, 2010]) or any other one-dimensional or two-dimensional SLM. The choice of elements used depends on the intended application, some of which are described herein. Each choice of intracavity elements has its own advantages and disadvantages relative to the performance, size, weight, and cost of the final device.

FIG. 2 shows multiple gain elements 40 stacked vertically in the plane perpendicular to the plane of the drawing. In a well-designed cavity, optical losses are similar for a large number of elements. In the particular case of semiconductor gain media, up to several tens of elements can be stacked close to each other, especially in the case when these are fabricated as waveguides on a single semiconductor wafer, as is customary in semiconductor manufacturing. The array of lasers fabricated on a single substrate is mounted "vertically", with lasers located one above the other, in the external cavity shown on FIG. 2. Due to their origin on multiple facets, output beams from individual gain elements will be displaced spatially in the "vertical" direction, in the amount corresponding to the distance between the facets. For most practical applications this displacement will be small enough to be either negligible or easily correctable. In non-limiting examples, the correcting optical system can be based on a fiber combiner or a diffraction grating with suitable optics, as is well known in the art.

With multiple lasers operating within a single cavity and independently tuned with a two-dimensional DMA, a wavelength-multiplexed laser source can be constructed. Such source provides both wide tuning range and high power output, both at individual wavelengths and in total output. In the case of a DMA as the SLM in the cavity, the modulation bandwidth reaches up to 32 kHz with commercially available DMAs [Digital Light Innovations, 2011]]. This bandwidth is high enough for most laser spectroscopy applications, since it is above the bulk of the low-frequency environmental noise.

Alternative Embodiment 1

Figure 3:
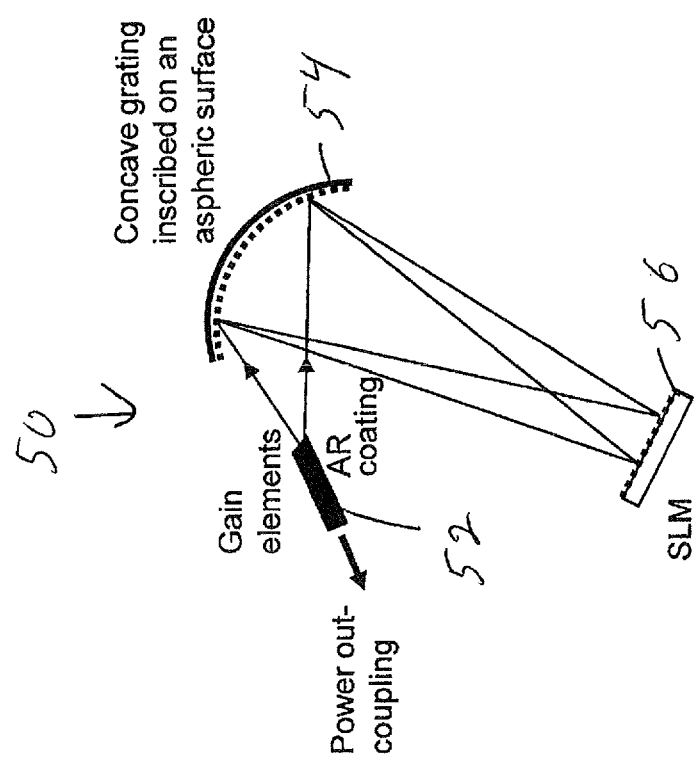
FIG. 3 is a schematic diagram of an external laser cavity with a single aspheric concave grating and wavelength tuning with a SLM.

FIG. 3 shows conceptually the simplest reflective design of cavity 50 with gain elements 52. A single optical element 54 performs both dispersion and imaging. In this design, a grating is inscribed on a highly corrected concave aspheric surface which both disperses and images the laser facets on the SLM 56. This approach poses a manufacturing challenge related to the aspheric element (close to a paraboloid). For a subset of these designs, multi-axis single point diamond turning (SPDT) manufacturing technology is capable of delivering the required performance, particularly at relatively long IR wavelengths (LWIR portion of the spectrum).

Alternative Embodiment 2

Figure 4A:
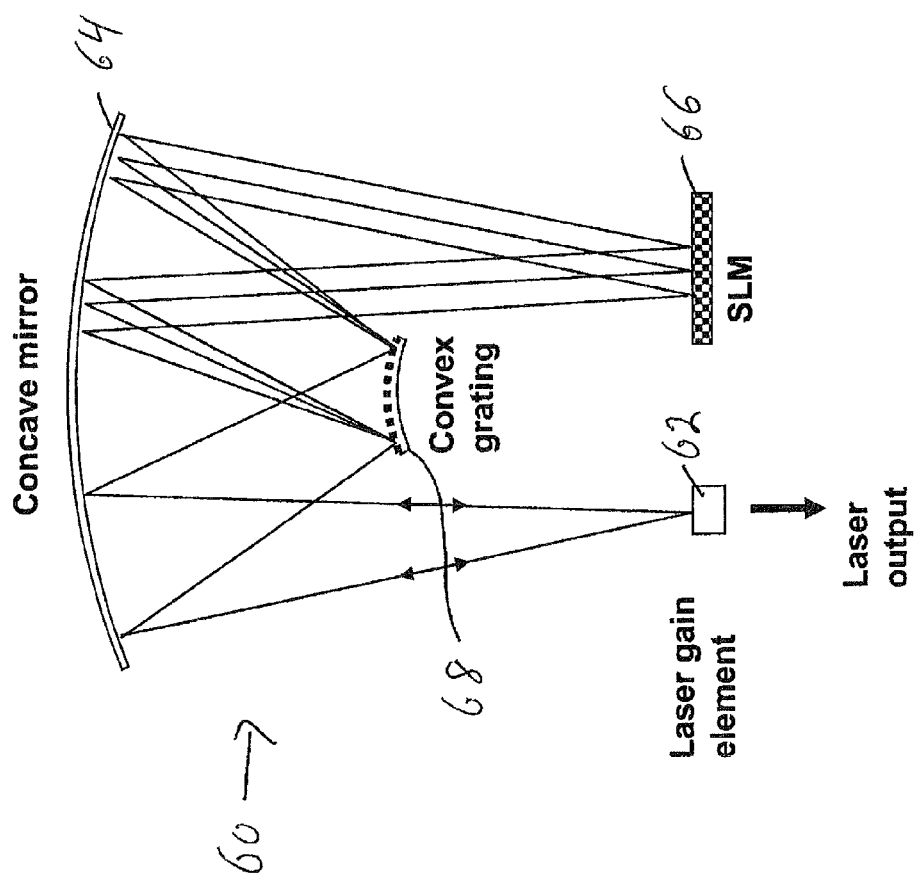
FIG. 4a is a schematic diagram of a dispersive Offner relay used for external cavity laser tuning with a SLM.
Figure 4B:
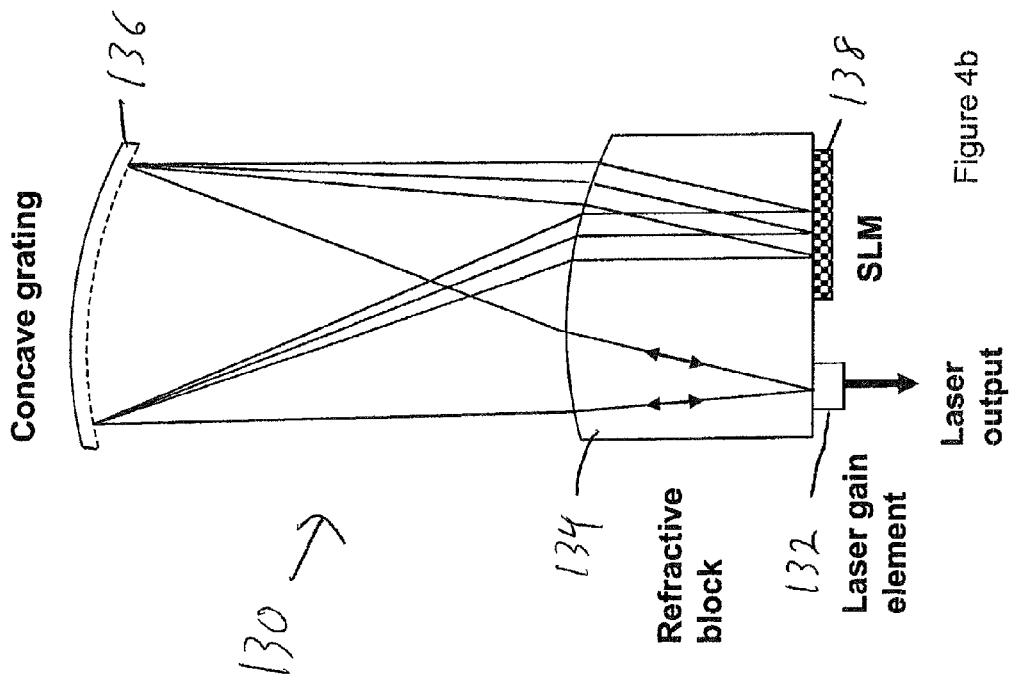
FIG. 4 b is a schematic diagram of a dispersive Dyson relay used for external cavity laser tuning with a SLM.

Designs of cavities based on concentric imaging spectrometers are illustrated in FIGS. 4a and 4b. A cavity 60 based on the Offner dispersive relay is shown on FIG. 4a while a cavity 130 based on Dyson relay is shown on FIG. 4b. The Offner configuration 60 uses a concave mirror 64 and a convex grating 68 to disperse and reimage the facet of the gain element 62 on the SLM 66. The Dyson configuration 130 uses a refractive block 134 and a concave grating 136 to disperse and reimage the facet of the gain element 132 on the SLM 138. The concentric design is capable of providing high numerical aperture to collect the laser output. It can work well with spherical-only surfaces, which makes it easier to manufacture.

Alternative Embodiment 3

Figure 5:
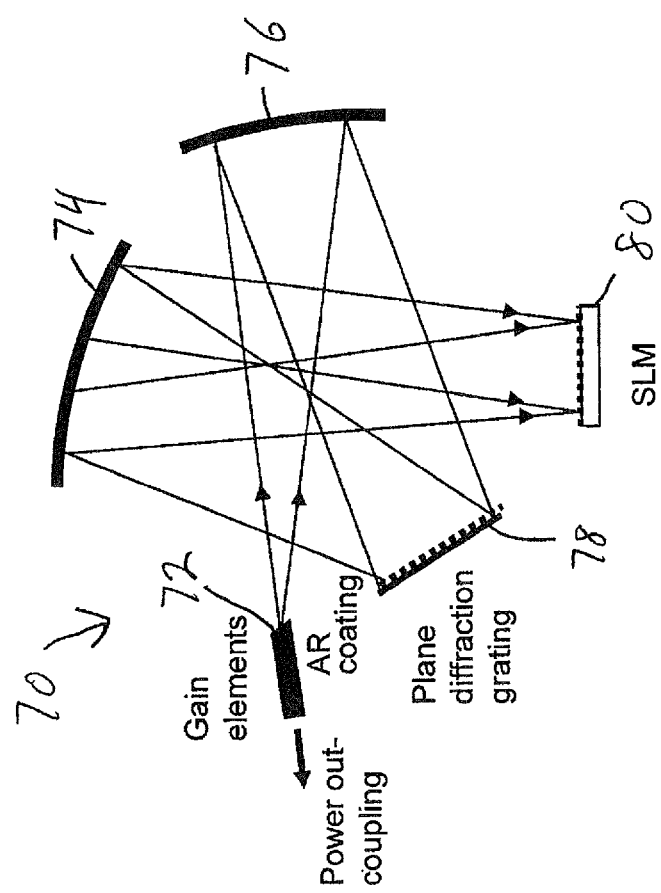
FIG. 5 is a schematic diagram of an external laser cavity with SLM tuning based on the crossed Czerny-Turner spectrometer design.

A design of cavity 70 based on the crossed Czerny-Turner spectrometer is shown on FIG. 5. This design has the advantage of using a plane grating 78, which relaxes the manufacturing complexity and cost. Two concave aspheric surfaces of high numerical aperture 74 and 76 collect and, together with a plane grating, disperse and reimage the laser facets 72 on the face of the SLM 80. The manufacturing challenge here is reduced relative to the Alternative Embodiment 1 because the manufacturing of aspheric surfaces is decoupled from the manufacturing of diffractive surfaces.

In cases with reflective gratings the initial prototyping cost can be high, but reflective machined surfaces can be subsequently precisely replicated at low cost for volume production.

Alternative Embodiment 4

Figure 6:
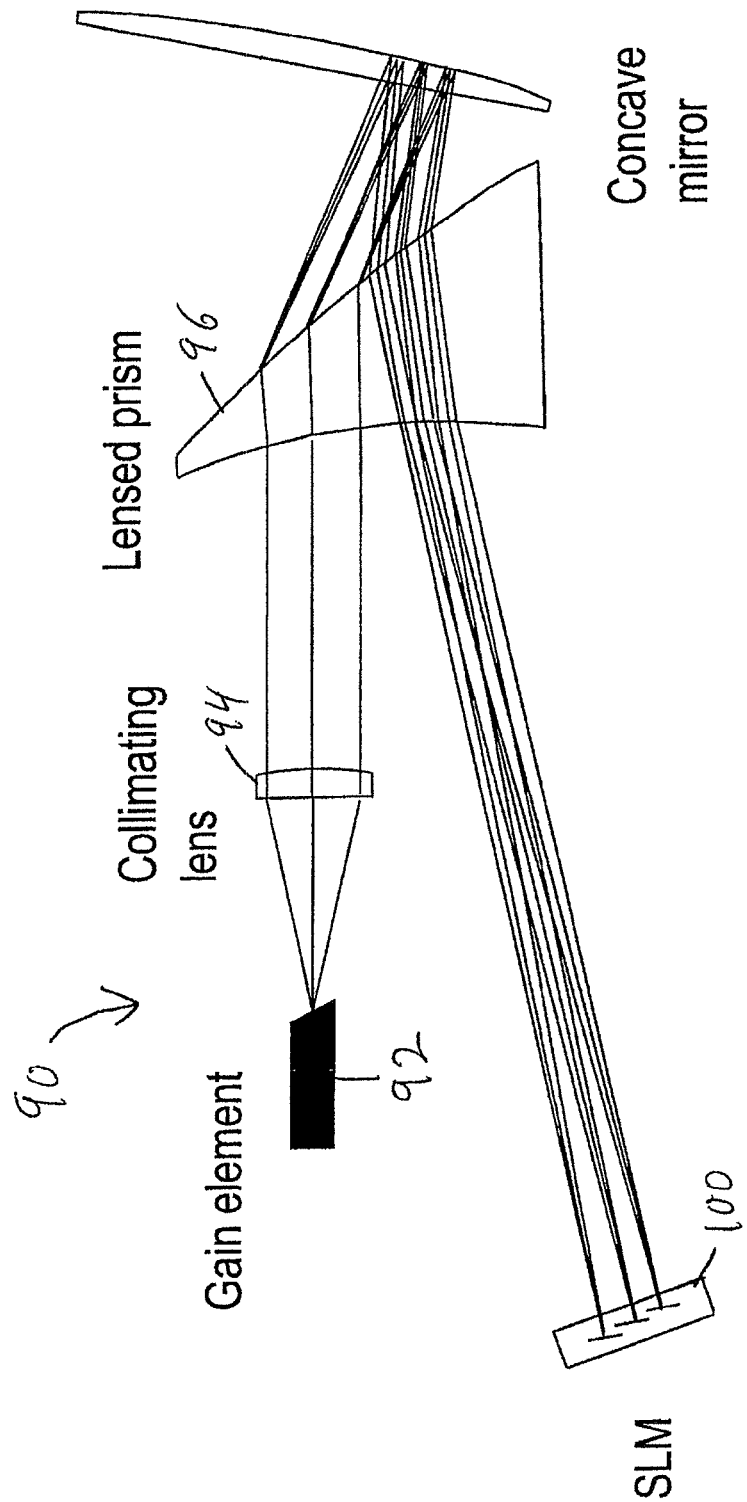
FIG. 6 is a schematic diagram of an external laser cavity with SLM tuning and with a lensed prism as the dispersing element.

An external cavity design 90 based on refractive instead of reflective optical elements is shown on FIG. 6. The cavity contains an antireflection (AR)-coated lensed prism 96 (a prism with curved surfaces) to both disperse and image the laser facet on gain element 92. Lens 94 is used to focus and image the light. The system images the output facet of the gain element on the surface of the SLM 100 with low distortion and with high spectral dispersion. (The inherently nonlinear wavelength-to-angle dependence of the prism dispersion can be easily corrected through a calibration routine in the spectrometer control software). The system contains only three optical elements besides the laser and the SLM, providing both simplicity and low internal cavity losses. The surfaces of the curved prism 96 are all spherical.

In a preliminary design, an aberration-corrected lens collimates the laser output beam and sends it through the lensed dispersion prism. A high-reflection (HR)-coated mirror reflects the beam back through the prism. The lensed prism focuses the dispersed beam onto the surface of the SLM modulator which sends the selected wavelength back to the laser facet. The overall size of the complete external laser cavity is favorable for practical external-cavity lasers. All optical surfaces in this system are either AR-coated (lens and prism) or HR-coated (mirror), with high efficiency broadband coatings.

Alternative Embodiment 5

Figure 7:
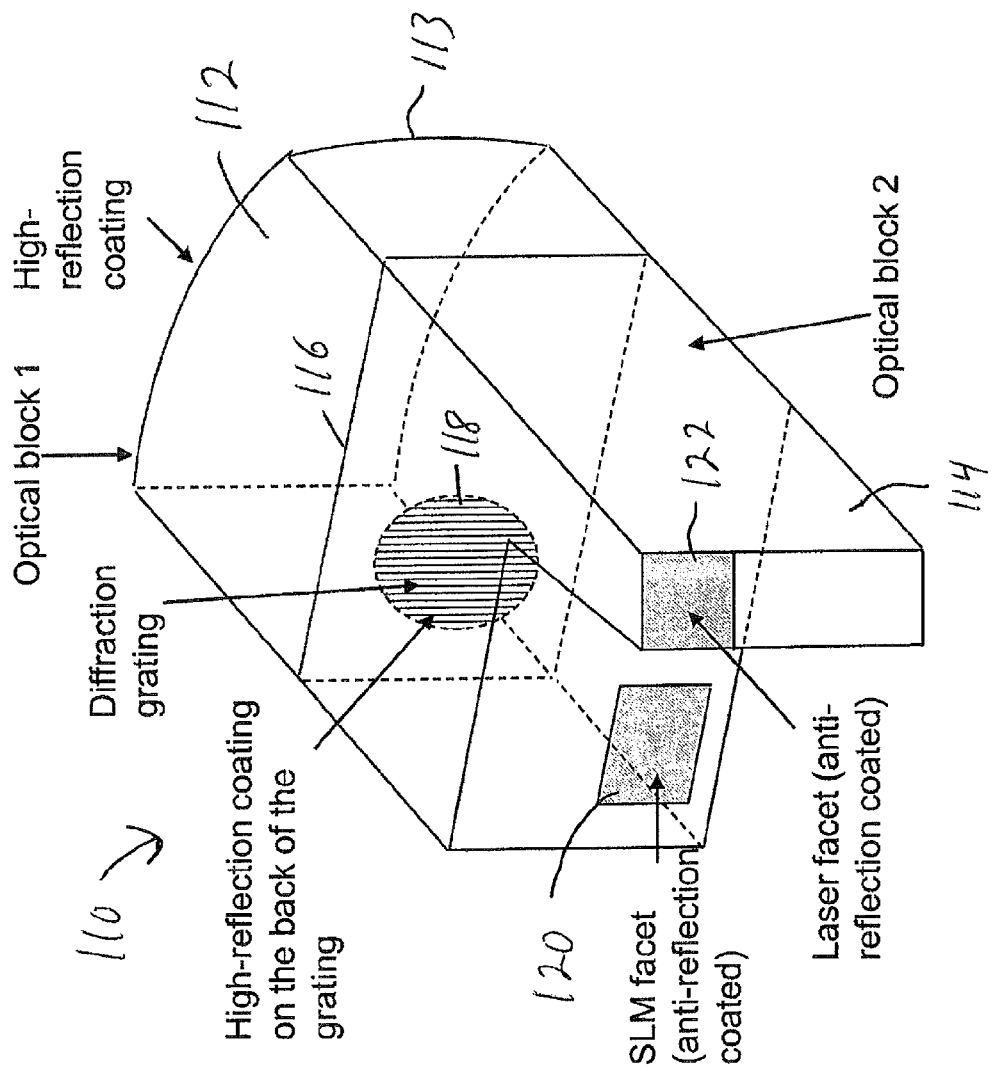
FIG. 7 is a schematic diagram of a solid-state external laser cavity based on the Offner dispersive relay design with SLM wavelength tuning.

External Laser Cavity Fabricated Out of Transparent Solid State Optical Material The external laser cavity can be built entirely or partially out of solid state material transparent in the spectral range of laser operation. In this design, the laser gain element and the SLM are directly attached to the cavity block. In one embodiment, the optical schematic of the cavity follows the principles of the Offner dispersive relay (FIG. 4a). More specifically, the cavity design 110 shown on FIG. 7 relies on the use of two solid pieces of transparent material (block 112 and block 114) into which the optical elements of the Offner concentric dispersive relay are machined by using e.g., the single point diamond turning (SPDT) manufacturing technique. The cavity is machined as two adjoined blocks joined at location 116. The cavity contains a high-reflection coated mirror (the rear face 113 of block 112), machined diffraction grating 118, and anti-reflection coated interfaces 120, 122 to which the laser gain element and the SLM are attached, respectively.

A solid state laser cavity can be also developed to accommodate multiple gain elements within a single external cavity. Each gain element can be independently tuned with a two-dimensional DMA, resulting in optimized tuning range/output power combination from a single solid state cavity. This design represents a foundation for a compact tunable laser source with exceptional shock and vibration resistance due to its monolithic solid state construction with no macroscopic moving parts. Additionally, the design removes the need for having an optical window, typically found on a SLM, thereby reducing intracavity losses and the cost of the laser.

Alternative Embodiment 6

Digitally Tunable External Laser Cavity of Alternative Embodiments 1-3 Coupled with on-Chip (in-Hardware) Processing for Data Acquisition The fast digitally tunable and modulatable laser source represents a foundation for a laser spectrometer that extends the idea of classical wavelength modulation absorption spectroscopy towards a "multiplexed" laser spectroscopic technique capable of improved detection sensitivity. The approach is to shorten the data acquisition cycle by reducing the number of wavelengths required for detection. Two possible approaches to developing the optimum combination of wavelengths are presented here.

The first approach is to reduce the number of wavelengths to be measured, confining them to spectral regions of interest for the specific analyte and for expected interferents and background features. These regions need not be contiguous. Once the wavelengths are identified, the absorbances can be measured by the digitally tunable laser spectrometer in a very short time.

Figure 8A:
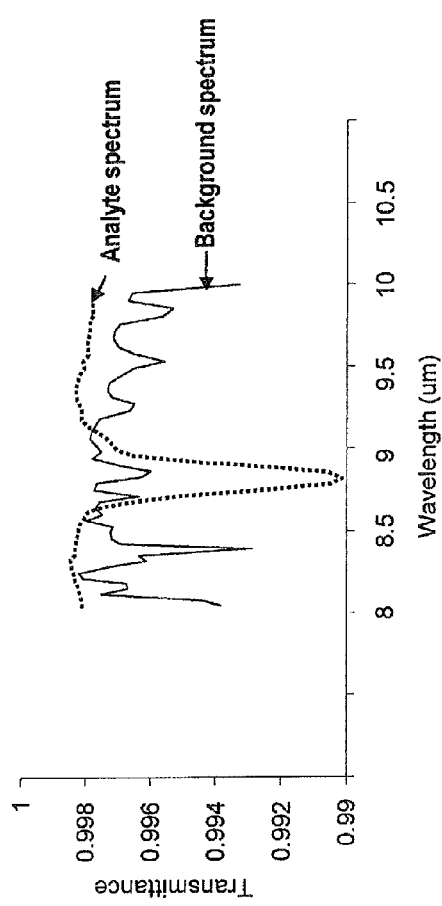
FIGS. 8a and 8b show a hypothetical example of a spectral signature consisting of an analyte spectrum superimposed on a background spectrum.
Figure 8B:
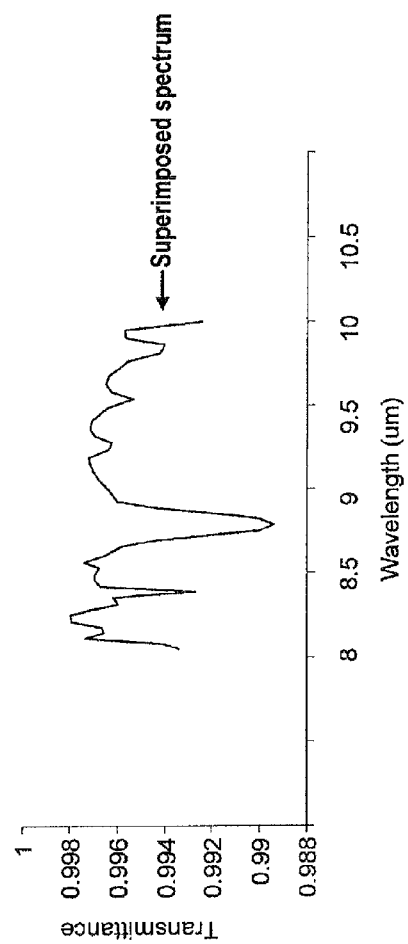

A second, possibly more powerful, approach, is to devise a sequence of wavelengths that, together with appropriate weighting factors, implements a "matched filter" for the analyte in the given spectral range. The matched filter is a filter vector that extracts, via linear projection, the analyte signal with optimal rejection of additive Gaussian clutter background, as characterized by a covariance matrix. It is a well-known technique for identifying a known spectral component belonging to a target analyte within a medium containing interfering spectral background (a hypothetical example shown on FIGS. 8a and 8b). The matched filter is a linear filter vector, i.e. a spectrum, whose dot product with the measured spectrum produces a value representing the strength of the analyte features present in the measured spectrum. The matched filter for an analyte contained within a background medium is the spectrum that gives the smallest rms value when applied to a scene that does not contain the analyte. See FIG. 8c. Thus the matched filter is the best linear filter, in the least square sense, for detecting a target analyte within the background. A matched filter can be constructed from two spectral templates, one representing the portion of the matched filter spectrum with positive values, and one representing the portion of the matched filter with negative values. See FIG. 8d. The application of the matched filter method with a tunable external cavity laser relies on generating a set of laser lines at prescribed wavelengths with prescribed intensity that produce the composite spectroscopic signal measured by the instrument. The matched filter "score" may be determined by making measurements in rapid succession with each of the spectral templates, and subtracting the two measurements. The discrete wavelength-intensity pairs on FIG. 8b constitute the "prescription" for the detection of the analyte within the analyte/background combination shown on FIG. 8a. With digitally controlled external cavity lasers sets of sequential laser wavelengths can be generated at high speed corresponding to the SLM frame rate (>30 kHz for a DMA).

The matched filter approach is advantageous when it can be effectively implemented with fewer wavelengths than the method that takes an end-to-end spectrum. These detection methods perform a part of the detection process in the data collection step, within the programmable hardware portion of the sensor. Therefore it has the advantages typical of "compressed sensing": the balance between the sensitivity, false alarm rate and the time to take a measurement is improved by not burdening the instrument with collecting and analyzing redundant and/or irrelevant data.

Alternative Embodiment 7

Digitally Tunable External Laser Cavity of Alternative Embodiments 1-4 Coupled with Advanced Wavelength Modulation Techniques Absorption spectroscopy with diode lasers traditionally relies on the technique of wavelength (frequency) modulation. This technique proved in the past to be one of the most sensitive spectroscopic detection techniques in existence [e.g., Bjorklund, G. C. "Frequency Modulation Spectroscopy: a new method for measuring weak absorptions and Dispersions", Opt. Lett. Vol. 5, 15 (1980)]. With this approach, the wavelength is modulated in the vicinity of the absorption line of the sample under investigation, making the demodulated detector output proportional to the derivative of the absorption line shape. The wavelength modulation technique is therefore also known as derivative or harmonic spectroscopy. The first (or any odd) derivative can be used for laser wavelength stabilization, by locking the laser to the zero value of the derivative waveform, which corresponds to the peak of the absorption line profile. The second (or any even) harmonic of the detected waveform produces a peak proportional to the peak of the absorption line at its center wavelength, and is typically used for analytical measurements such as absorber concentration in the sample. The modulation bandwidth of the disclosed external cavity laser, at several tens of kHz, is high enough for typical wavelength modulation spectroscopy application, since it is above the bulk of the environmental noise. This makes the tuning/modulation mechanism of the disclosed external cavity laser well suited for wavelength modulation spectroscopy, with the advantage of wide and fast spectral coverage for wavelength modulation.

Advanced wavelength modulation with the disclosed laser can be performed by modulating different wavelengths of interest at different frequencies, so that signals at multiple wavelengths specific to the analyte may be combined, resulting in a higher signal-to-noise ratio. These wavelengths might also include wavelengths detecting interferents, whose second derivative signals could be generated with the opposite phase, and thus subtracted from the analyte signal at the demodulation step, leading to yet another form of compressed spectral sensing with the disclosed laser source.

The ability of the disclosed digitally controlled external cavity laser to access any wavelength at random opens up the possibility to perform derivative spectroscopy in which non-adjacent wavelengths are modulated during the generation of the derivative signal. This feature represents a potentially superior detection modality with laser spectrometers.

Application: Infrared Spectrometer for Analytical Spectrometry

Figure 9:
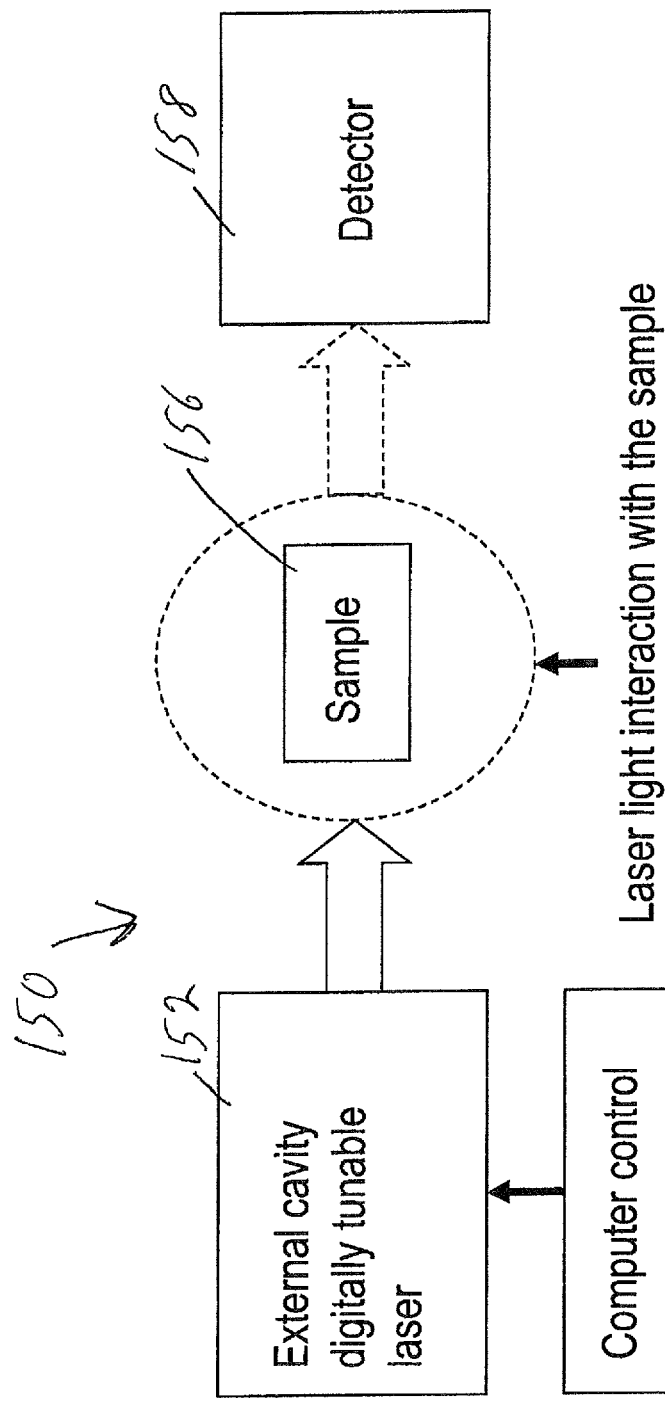
FIG. 9 is a schematic of a generalized laser spectrometer.

Widely tunable IR laser sources with random wavelength access and with the capability for advanced modulation techniques can be used as basic building blocks for advanced analytical instruments used in analytical chemistry, both in laboratory and field applications. Infrared quantum cascade lasers (QCL) built into the subject digitally tunable cavity would produce analytical instruments that surpass currently standard analytical spectrometry equipment based on Fourier Transform Infrared (FTIR) technology. Digitally tunable external cavity QCLs offer better detection sensitivity, higher speed, smaller size, and are mechanically more stable for field use. FIG. 9 illustrates spectrometer 150 comprising a subject external cavity digitally tunable laser 152 under computer control 154. The output is provided to sample 156. Detector 158 creates the spectrometer output.

Application: Infrared Spectral Imaging Microscope

Figure 10:
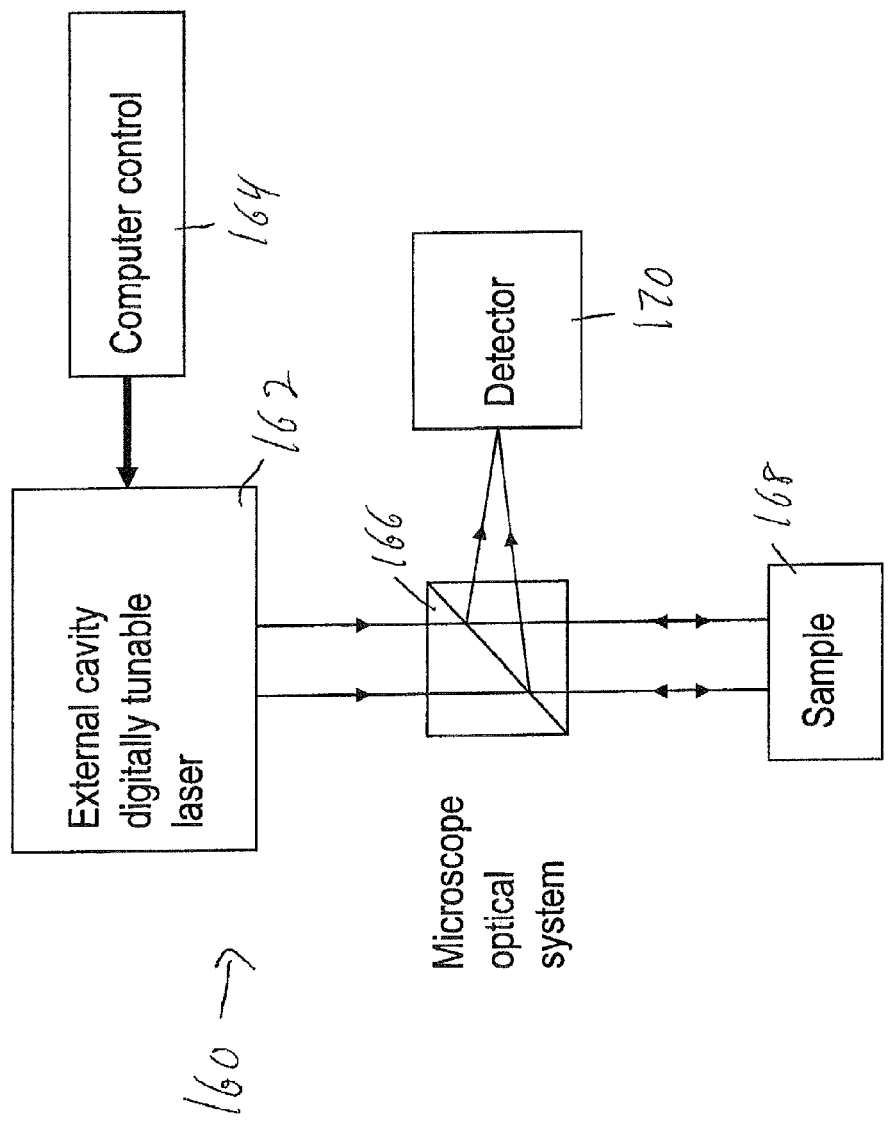
FIG. 10 is a schematic of a generalized laser illuminated microscope.

For applications in reflectance or transmittance microscopy, particularly related to biology and biomedical applications, it is desirable to have a laser source that scans over several tens of laser wavelengths in the mid- and long-wave IR range within a time interval of several milliseconds. The digitally controlled external cavity laser disclosed here provides such performance. The laser provides fast (<0.1 ms per step) wavelength tuning, stable and reproducible wavelength locking and fast (>30 kHz) wavelength modulation that can be used for advanced signal detection algorithms. High optical power available from a digitally tunable quantum cascade laser (QCL) will provide the spectral imaging microscope with a high signal-to-noise ratio, even for samples with weak absorption bands. The design and construction of a laser-based microscope has been traditionally based on two-dimensional scanning of the laser beam over the sample. However, due to the high power available from QCLs, flood illumination of the entire sample simultaneously becomes possible, resulting in dramatically increased speed of data acquisition. FIG. 10 illustrates spectral imaging microscope 160 with a subject external cavity digitally tunable laser 162 under computer control 164. The output is handled by optical system 166 and provided to sample 168. Detector 170 creates the microscope output.

Application: Spectrometer for Standoff Detection

A standoff spectroscopic detection instrument based on the subject digitally controlled external cavity laser can be built based on quantum-cascade gain elements. Recently, multiple-100 mW output quantum cascade lasers (QCL) were demonstrated in the mid- and long-wave IR range (e.g., [Lyakh et al., 2010]). The standoff sensor uses scattering at the hard surface of the target to generate the return signal. Depending on the output power used, the receiver detector can be cooled either thermoelectrically or by cryogenic cooler.

The signal modulation/demodulation technique for the standoff sensor can be based on the wavelength modulation approach, with spectral coverage in a wide spectral range and with advanced processing algorithms in order to remove the effects of atmospheric and target reflectance interferents. Non-limiting examples of advanced in-hardware processing relevant here are (1) derivative spectroscopy with non-adjacent "random access" wavelengths and (2) matched filter. Previous work on a standoff sensor of methane as an indicator of leaks in natural gas pipelines [Vujkovic-Cvijin et al., 1999, 2001] demonstrated the extension of the technique of wavelength modulation spectroscopy from in situ absorption cells to an open atmospheric path with natural target scattering providing the return beam.

Application: Trace Gas Spectrometer for In-Situ Monitoring

For trace gas detection in dynamic gas mixtures in the presence of interferents, several tens of laser wavelengths in the mid- and long-wave IR range need to be scanned within several milliseconds. The digitally controlled external cavity laser with DMA modulation provides fast (<0.1 ms switching time) wavelength tuning, stable and reproducible wavelength locking and fast (>30 kHz) wavelength modulation for derivative signal detection, as in traditional wavelength modulation spectroscopy. With the recently developed QCLs, it is possible to cover a wide portion of the long-wave IR spectral range with the output power of several tens to hundreds milliwatts per laser line, and with the spectral resolution of less than 1 $cm^{-1}$ to more than 10 $cm^{-1}$. In one exemplary, non-limiting embodiment of the sensor, the tunable wavelength-modulated laser illuminates a photoacoustic cell, where the energy absorbed in the target gas generates an acoustic signal detected with high sensitivity by phase-sensitive or equivalent detection. Due to the unique capabilities of the subject digitally controlled external cavity laser, sophisticated compressed sensing processing algorithms such as derivative detection with non-adjacent wavelengths and matched filtering can be implemented for data collection.

While the foregoing written description enables one of ordinary skill to make and use what is considered presently to be the best modes thereof, those of ordinary skill will understand and appreciate the existence of variations, combinations, and equivalents of the specific embodiments, methods, and examples herein. The invention should therefore not be limited by the above described embodiments, methods, and examples, but by all embodiments and methods within the scope and spirit of the invention.

What is claimed is:

1. A sensor system, comprising:
   (a) a frequency agile tunable laser that has an external cavity and an output, the laser comprising:
      (i) one or more tunable gain elements providing sources of optical radiation at different wavelengths;
      (ii) a spectral dispersion device acting on the radiation produced by the gain elements to produce radiation dispersed into separate wavelengths; and
      (iii) a spatial light modulator (SLM) defining a plurality of programmable sub-apertures that determine the wavelengths of the laser output, where the laser output is provided to a sample;
   (b) a control system that applies a mathematical transform to the SLM to generate a detection filter for an analyte in the sample, the detection filter comprising a set of laser output wavelengths with defined intensities; and
   a detector that collects laser output after its exposure to the sample.

2. The sensor system of claim 1 wherein the control system controls the SLM so as to perform random access in a time domain to any laser wavelength within the spectra of the gain elements.

3. The sensor system of claim 1 wherein the control system controls the SLM so as to perform chemical analysis or material identification in a short time period by reducing the number of laser wavelengths used, confining them to spectral regions of interest for characterizing one or more of the following: a specific analyte, expected interferents or a spectral background.

4. The sensor system of claim 3 where the spectral regions of interest are not contiguous.

5. The sensor system of claim 1 wherein the control system controls the SLM so as to accomplish time-multiplexed modulation of multiple laser wavelengths, or a matched filter, or derivative spectroscopy, or derivative spectroscopy with non-adjacent wavelengths.

6. The sensor system of claim 1 wherein the control system causes the SLM sub-apertures to change their properties so as to modulate at least two or more different laser output wavelengths at different modulation frequencies.

7. The sensor system of claim 1 wherein the control system is enabled to automatically perform spectroscopic signal processing by using the SLM to generate sets of laser output wavelengths with defined intensities in order to create a detection filter with positive and negative values, and wherein the control system implements the detection filter as two spectral templates, one representing a portion of the filter with positive values, and one representing a portion of the filter with negative values in order to achieve spectral matched filtering which distinguishes a specific analyte in contrast to the expected interferents and background spectral features.

8. The sensor system of claim 1 wherein the SLM comprises a digital micromirror array.

9. The sensor system of claim 1 wherein the control system controls the SLM so as to generates a set of output laser wavelengths in order to enhance the detection sensitivity of the sensor system, or to reduce the number of laser wavelengths required or to reduce the time needed to perform chemical analysis or material identification, or to decrease the total laser power needed to perform chemical analysis or material identification.

10. The sensor system of claim 1, wherein the control system is enabled to automatically performs spectroscopic signal processing by causing the sup-apertures of the SLM to change their properties to select a set of non-contiguous wavelengths for use in chemical analysis or material identification;
   where the selected wavelengths correspond to the spectral regions of interest of the analyte and are selected to enhance the detection sensitivity of the sensor system, or to reduce the number of laser wavelengths required, or to reduce the time needed to perform chemical analysis or material identification, or to decrease the total laser power required.

11. The sensor system of claim 10 wherein the control system is enabled to automatically perform spectroscopic signal processing by using the SLM to perform time-multiplexed modulation of multiple laser wavelengths.

12. The sensor system of claim 10 wherein the control system is enabled to automatically perform spectroscopic signal processing by using the SLM to generate sets of laser wavelengths in order to perform derivative spectroscopy.

13. The sensor system of claim 10 wherein the control system causes the SLM to modulate at least two or more different laser output wavelengths at different modulation frequencies, allowing the application of synchronous signal detection technique to the detection of the spectroscopic signal at two or more of the output wavelengths simultaneously.

14. The sensor system of claim 10 wherein the control system is enabled to automatically perform spectroscopic signal processing by using the SLM to generate sets of laser output wavelengths with defined intensities in order to create a detection filter with positive and negative values, and wherein the control system implements the detection filter as two spectral templates, one representing a portion of the filter with positive values, and one representing a portion of the filter with negative values in order to achieve spectral matched filtering which distinguishes a specific analyte in contrast to the expected interferents and background spectral features.

15. The sensor system of claim 10 wherein the SLM comprises is digital micromirror array.

* * * * *